US012593691B2

(12) United States Patent
Son et al.

(10) Patent No.: US 12,593,691 B2
(45) Date of Patent: Mar. 31, 2026

(54) SEMICONDUCTOR DEVICE WITH TWO-PHASE COOLING STRUCTURE INCLUDING ULTRASONIC TRANSDUCER

(71) Applicant: SAMSUNG ELECTRONICS CO., LTD., Suwon-si (KR)

(72) Inventors: Daehyuk Son, Suwon-si (KR); Sungchan Kang, Suwon-si (KR); Seogwoo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 18/198,506

(22) Filed: May 17, 2023

(65) Prior Publication Data

US 2024/0203824 A1        Jun. 20, 2024

(30) Foreign Application Priority Data

Dec. 20, 2022    (KR) ........................ 10-2022-0179736

(51) Int. Cl.
  *H01L 23/473*        (2006.01)
  *H10N 30/20*         (2023.01)
(52) U.S. Cl.
  CPC ....... *H01L 23/473* (2013.01); *H10N 30/2047* (2023.02)
(58) Field of Classification Search
  CPC .......................... H01L 23/473; H10N 30/2047
  See application file for complete search history.

(56) References Cited

U.S. PATENT DOCUMENTS

| | | | |
|---|---|---|---|
| 6,498,725 B2 | 12/2002 | Cole et al. | |
| 7,092,254 B1* | 8/2006 | Monsef ................. H01L 23/473 | |
| | | | 174/15.1 |
| 9,557,117 B2 | 1/2017 | Yoshikawa et al. | |
| 2006/0131737 A1 | 6/2006 | Im et al. | |
| 2011/0205708 A1 | 8/2011 | Andry et al. | |
| 2012/0145361 A1 | 6/2012 | Glezer et al. | |
| 2013/0148305 A1* | 6/2013 | Ankireddi ............... H01L 23/44 | |
| | | | 361/718 |
| 2017/0179001 A1* | 6/2017 | Brunschwiler ....... H01L 23/427 | |
| 2020/0105644 A1 | 4/2020 | Teng et al. | |
| 2021/0098335 A1 | 4/2021 | Yu et al. | |

(Continued)

FOREIGN PATENT DOCUMENTS

| | | |
|---|---|---|
| CN | 106784411 B | 11/2018 |
| JP | 5757086 B2 | 7/2015 |

OTHER PUBLICATIONS

Zhang et al., "A review of the state-of-the-art in electronic cooling," e-Prime—Advances in Electrical Engineering, Electronics and Energy, vol. 1, No. 100009, 2021, total 26 pages.

(Continued)

*Primary Examiner* — Michael Jung
(74) *Attorney, Agent, or Firm* — Sughrue Mion, PLLC

(57) ABSTRACT

A semiconductor device includes a semiconductor chip including a semiconductor integrated circuit, and a cooling channel formed in the semiconductor chip and providing a moving path for a coolant. An ultrasonic vibrator may be arranged in the cooling channel. The ultrasonic vibrator may vibrate the coolant. By doing so, the stagnation of vapors and/or generation of a vapor film may be reduced or prevented.

19 Claims, 15 Drawing Sheets

(56) References Cited

U.S. PATENT DOCUMENTS

| 2024/0203821 | A1 | 6/2024 | Kang et al. | |
| 2024/0332128 | A1* | 10/2024 | Uzoh | .................... H01L 23/433 |

OTHER PUBLICATIONS

Anonymous, "Film Boiling," Retrieved from https://www.nuclear-power.com/nuclear-engineering/heattransfer/boiling-and-condensation/boiling-boilingcharacteristics/film-boiling/, Copyright 2024, total 9 pages.

Wang et al., "Review of aerospace-oriented spray cooling technology," Progress in Aerospace Sciences, vol. 116, No. 100635, 2020, total 14 pages.

Wu et al., "Thermal modeling and comparative analysis of jet impingement liquid cooling for high power electronics," International Journal of Heat and Mass Transfer, vol. 137, pp. 42-51, 2019.

* cited by examiner

SEMICONDUCTOR DEVICE WITH TWO-PHASE COOLING STRUCTURE INCLUDING ULTRASONIC TRANSDUCER

CROSS-REFERENCE TO RELATED APPLICATION

This application is based on and claims priority under 35 U.S.C. § 119 to Korean Patent Application No. 10-2022-0179736, filed on Dec. 20, 2022, in the Korean Intellectual Property Office, the disclosure of which is incorporated by reference herein in its entirety.

BACKGROUND

1. Field

The disclosure relates to a semiconductor device having a cooling structure.

2. Description of the Related Art

Generally, in electronic devices, such as computers, air cooling devices have been commonly used to remove heat generated from the electronic devices. As the power density of electronic devices has been gradually increased, the use of cooling devices to cope with the raised heating value has also increased. In addition, in case of a data center, there is a growing interest in next-generation cooling methods with high efficiency, such as a liquid cooling device to reduce the power consumption. Cooling methods may be divided into a single-phase liquid cooling method, which does not involve a phase change of a coolant according to a temperature range of a heat-generating portion, and a two-phase liquid cooling method, which is accompanied by a phase change of a coolant. The two-phase cooling method has a wider capable range of heating value than the single-phase method.

SUMMARY

Provided is a semiconductor device with a two-phase cooling structure.

Provided is a semiconductor device with a two-phase cooling structure capable of removing vapors attached to a heat transfer surface of a semiconductor chip.

Additional aspects will be set forth in part in the description which follows and, in part, will be apparent from the description, or may be learned by practice of the presented embodiments of the disclosure.

According to an aspect of the disclosure, there is provided a semiconductor device including: a semiconductor chip including a semiconductor integrated circuit; a cooling channel formed in the semiconductor chip, the cooling channel configured to provide a path for moving a coolant; and an ultrasonic vibrator arranged in the cooling channel and configured to vibrate the coolant.

The ultrasonic vibrator may be at least partially provided in the coolant in the cooling channel.

The ultrasonic vibrator may be arranged on a heat transfer surface adjacent to the semiconductor integrated circuit of the cooling channel.

The ultrasonic vibrator may extend in a transverse direction parallel with the heat transfer surface.

The ultrasonic vibrator may extend from the heat transfer surface in a thickness direction of the semiconductor chip.

The ultrasonic vibrator may include a plurality of ultrasonic vibrators.

The semiconductor device may further include: a capillary pattern configured to move the coolant by a capillary force, wherein the capillary pattern is formed on at least a part of a wall of the cooling channel.

The capillary pattern may be formed on a heat transfer surface adjacent to the semiconductor integrated circuit of the cooling channel.

The ultrasonic vibrator may include a plurality of ultrasonic vibrators, and wherein the plurality of ultrasonic vibrators form a capillary pattern configured to the coolant by a capillary force in the cooling channel.

The ultrasonic vibrator may extend in a thickness direction of the semiconductor chip from a heat transfer surface adjacent to the semiconductor integrated circuit of the cooling channel.

The ultrasonic vibrator may include a micro-machined ultrasonic transducer.

The semiconductor chip may include a first semiconductor chip and a second semiconductor chip stacked on the first semiconductor chip, wherein the cooling channel may include a first cooling channel provided in the first semiconductor chip and a second cooling channel provided in the second semiconductor chip, wherein the ultrasonic vibrator may include a first ultrasonic vibrator provided in the first semiconductor chip and a second ultrasonic vibrator provided in the second semiconductor chip.

According to another aspect of the disclosure, there is provided a semiconductor device including: a semiconductor chip including a substrate and a semiconductor integrated circuit formed on a first surface of the substrate; a cooling channel formed on the substrate, the cooling channel configured to provide a path for moving a coolant; and a micro-machined ultrasonic transducer arranged at least partially provided in the coolant in the cooling channel and configured to vibrate the coolant.

The semiconductor device may further include: a capillary pattern configured to move the coolant by a capillary force in the cooling channel, wherein the capillary pattern is formed on at least a part of a wall of the cooling channel.

The micro-machined ultrasonic transducer may be arranged on a heat transfer surface adjacent to the semiconductor integrated circuit of the cooling channel.

The micro-machined ultrasonic transducer may include a plurality of micro-machined ultrasonic transducers, and wherein the plurality of micro-machined ultrasonic transducers may form the capillary pattern configured to move the coolant.

The micro-machined ultrasonic transducer may extend in a thickness direction of the semiconductor chip from a heat transfer surface adjacent to the semiconductor integrated circuit of the cooling channel.

The micro-machined ultrasonic transducer may include a piezoelectric micro-machined transducer (pMUT).

The semiconductor chip may include a first semiconductor chip and a second semiconductor chip stacked on the first semiconductor chip, wherein the cooling channel includes a first cooling channel provided in the first semiconductor chip and a second cooling channel provided in the second semiconductor chip, wherein the micro-machined ultrasonic transducer includes a first micro-machined ultrasonic transducer provided in the first semiconductor chip and a second micro-machined ultrasonic transducer provided in the second semiconductor chip.

According to an aspect of the disclosure, there is provided an electronic device including: a substrate including a plurality of electronic components; a cooling channel formed in the substrate, the cooling channel configured to provide a path for moving a coolant; and a vibrator arranged in the cooling channel and configured to vibrate the coolant.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
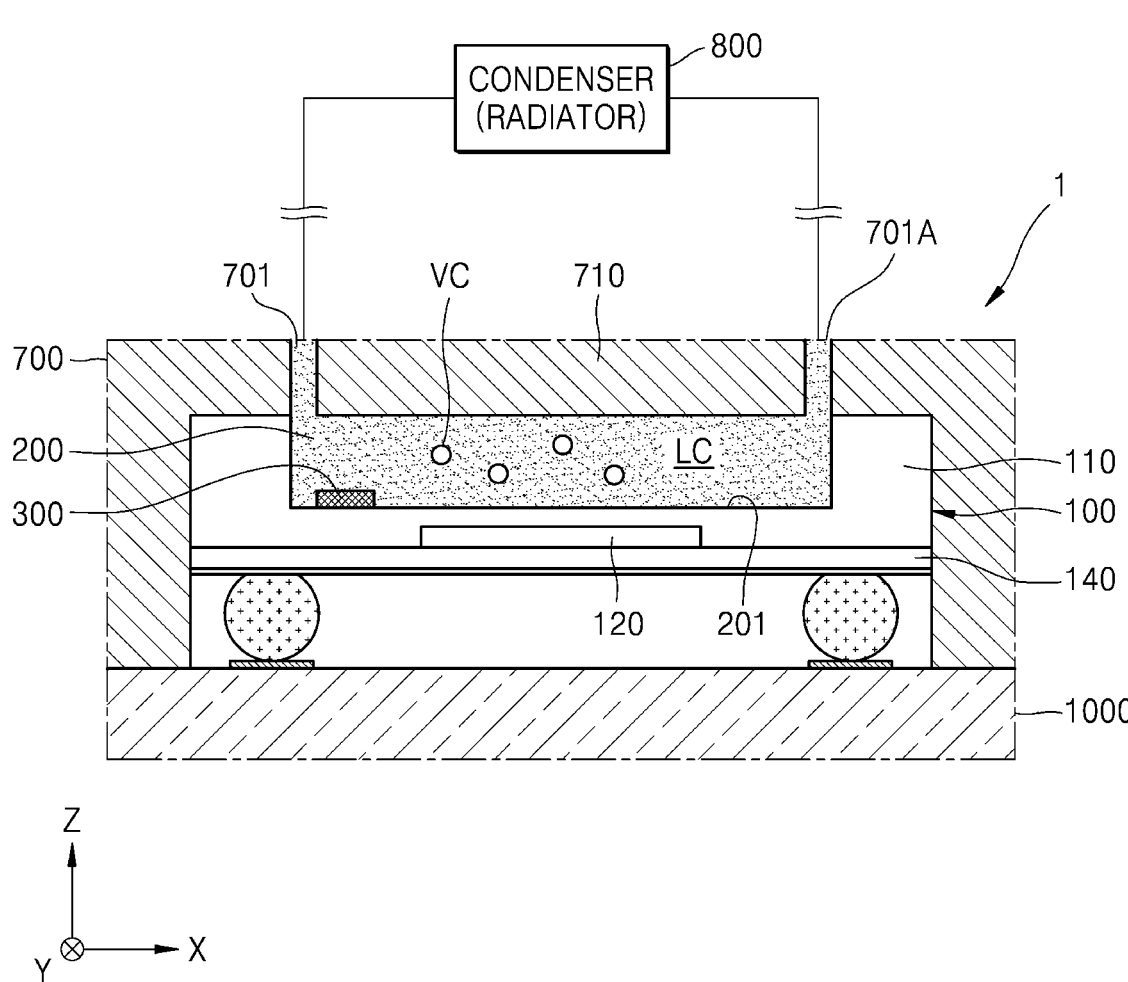
FIG. 1 is a schematic structural diagram of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the drawings, like reference numerals in the drawings denote like elements, and sizes of components in the drawings may be exaggerated for clarity and convenience of explanation. Meanwhile, embodiments described below are provided only as an example, and thus can be embodied in various forms. It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. When a portion "includes" an element, another element may be further included, rather than excluding the existence of the other element, unless otherwise described. The use of the terms "a" and "an" and "the" and similar referents in the context of describing embodiments (especially in the context of the following claims) are to be construed to cover both the singular and the plural. The operations of all methods described herein can be performed in any suitable order unless otherwise indicated herein or otherwise clearly contradicted by context, and embodiments are not limited to the described order of the operations. Moreover, the terms "part," "module," etc. refer to a unit processing at least one function or operation, and may be implemented by a hardware, a software, or a combination thereof. The connecting lines, or connectors shown in the various figures presented are intended to represent exemplary functional relationships and/or physical or logical couplings between the various elements, and thus it should be noted that many alternative or additional functional relationships, physical connections or logical connections may be present in a practical device. The use of any and all examples, or exemplary language provided herein, is intended merely to better illuminate technical ideas and does not pose a limitation on the scope of embodiments unless otherwise claimed.

In order to address a cooling problem that has been a limiting factor in the performance of electronic devices including semiconductor devices an efficient cooling system is required. For example, high performance computing (HPC) fields and semiconductor devices are implemented with stacked three-dimensional semiconductor integrated circuits in an highly integrated manner resulting in increased power density and increased heat generation. As such, a cooling system capable of responding to an increase in power density and an increase in heat generation due to high integration of the stacked three-dimensional semiconductor integrated circuits and other electronic components is required. In order to meet these demands, a two-phase liquid cooling system capable of utilizing latent heat of vaporization of a coolant may be applied to an integrated circuit device. The two-phase liquid cooling method may include immersion cooling, spray cooling, and jet impingement cooling.

The immersion cooling is a method of cooling an electronic device to be cooled by immersing the electronic device in a bath containing a liquid coolant. The immersion cooling method is the most widely used method, but because the entire electronic device needs to be immersed in a liquid coolant, the usable coolant is limited to a dielectric coolant. Therefore, the immersion cooling method has several problems such as high management costs and the method is not environmentally friendly. Moreover, when a film boiling phenomenon in which vapor of the coolant is adsorbed to a heating surface occurs, the vapor prevents heat transfer from the heating surface to the coolant, thereby reducing cooling efficiency. In a boiling graph, this phenomenon is called critical heat flux (CHF), and it is necessary to improve the CHF to cool a larger heat flux.

The spray cooling is a method of atomizing a liquid coolant and spraying the coolant on a heating surface and has high cooling efficiency compared to the amount of liquid coolant used. However, a spray cooling device requires a pumping device capable of operating at high pressure and requires continuous maintenance of spray nozzles. The spray cooling also has a problem of lowering cooling efficiency due to a film boiling phenomenon.

The jet impingement cooling is a cooling method in which a liquid coolant is injected to a heating surface at a high speed. Similar to the spray cooling method, the jet impingement cooling method also has high cooling efficiency. However, the jet impingement cooling method has a disadvantage of requiring several injectors to evenly cool the heating surface. Furthermore, even if several injectors are used, there may be a blind area where the jet of liquid coolant does not reach. In addition, the jet impingement cooling also has a problem of a decrease in cooling efficiency due to a film boiling phenomenon.

According to an example embodiment of the disclosure, there is provided a two-phase cooling system including a cooling channel, which is a path for a coolant, in a cooling target. For example, the two-phase cooling system may form a coolant channel in a semiconductor chip. In the cooling channel, a vibrator may be provided. For example, an ultrasonic vibrator applying a vibration to a coolant may be arranged in the cooling channel. In a cooling channel, a liquid coolant may absorb heat from a heat transfer surface adjacent to a heat source and vaporize into vapor. When vapors are attached to the heat transfer surface and become stagnant, due to the film boiling phenomenon, the cooling efficiency may decline, and hot spots may be generated. According to the two-phase cooling system of the disclosure, the ultrasonic vibrator may vibrate the coolant in the cooling channel. The vibration energy of the ultrasonic vibrator may be transmitted to the vapors attached to the heat transfer surface along the coolant, and the vapors may be detached from the heat transfer surface. In this manner, the film boiling phenomenon may be reduced or prevented. As the vibration is applied to the coolant, no damage may be caused to the cooling target, for example, components of the semiconductor chip. According to an embodiment, a linear resonant actuator (LRA) may be employed as the vibrator. According to an embodiment, a micro-machined ultrasonic transducer (MUT) may be employed as the ultrasonic vibrator. The micro-machined ultrasonic transducer may be easily implemented in the semiconductor chip by micro-electron mechanical systems (MEMS) technologies. According to an embodiment, a capillary pattern generating capillary force which moves the liquid coolant may be formed in the cooling channel. As the coolant is moved by the capillary force, in some cases, a coolant supplying member, such as a high-capacity pump, etc. for supplying a coolant to a cooling channel may be omitted, and thus, the prices and power consumption of the cooling system may be reduced. In addition, as the capillary pattern increases a heat transfer area of the heat transfer surface, the heat exchange from a heat source, for example, a semiconductor integrated circuit to the coolant may be facilitated. The capillary pattern may be implemented by an ultrasonic vibrator, for example, a micro-machined ultrasonic vibrator.

In the following description, a first direction (X) denotes one of the directions parallel to an upper surface of the semiconductor chip. A second direction (Z) denotes a thickness direction of the semiconductor chip. A third direction (Y) denotes a direction orthogonal to the first direction (X) among directions parallel to the upper surface of the semiconductor chip.

FIG. 1 is a schematic structural diagram of a semiconductor device 1 according to an embodiment. With reference to FIG. 1, the semiconductor device 1 may include a semiconductor chip 100, a cooling channel 200, and an ultrasonic vibrator 300. The semiconductor device 1 may be an integrated circuit device including an integrated circuit die.

The semiconductor chip 100 may include a substrate 110 and a semiconductor integrated circuit 120 formed on a surface of the substrate 110. The semiconductor chip 100 may be various semiconductor chips. For example, the semiconductor chip 100 may be a memory die including a memory integrated circuit, a logic die including a logic integrated circuit, a central processing unit (CPU) chip, a graphic processing unit (GPU) chip, an application specific integrated circuit (ASIC) chip, etc. To implement the semiconductor device 1 having a small form factor, the semiconductor chip 100 may be a wafer-level semiconductor integrated circuit chip. In this case, the substrate 110 may be a wafer. The semiconductor chip 100 may be, for example, mounted on a printed circuit board 1000 by a solder ball. A wiring layer 140 for electrically connecting the semiconductor integrated circuit 120 with the printed circuit board 1000 may be arranged under the semiconductor chip 100. The wiring layer 140 may be electrically passivated with respect to the outside.

According to an embodiment, a two-phase liquid cooling structure may include the cooling channel 200. The cooling channel 200 may provide a moving path for a coolant. At least a part of the cooling channel 200 may be formed in the semiconductor chip 100, for example, in the substrate 110. For example, at least a part of the cooling channel 200 may be formed on a surface of the substrate 110 opposite to a surface of the substrate 110 on which the semiconductor integrated circuit 120 is formed. For example, the semiconductor integrated circuit 120 may be formed on a first surface of the substrate 110 and at least a part of the cooling channel 200 may be formed on a second surface of the substrate 110. The cooling channel 200 may be connected to a condenser 800 (or a radiator). For example, the semiconductor chip 100 may be packaged by a package housing 700. The package housing 700 may surround the semiconductor chip 100. In FIG. 1, the cooling channel 200 may be entirely formed in the semiconductor chip 100, for example, in the substrate 110. An upper wall 710 of the package housing 700 may form an upper wall of the cooling channel 200. An opening 701 connected with the cooling channel 200 may be arranged in the package housing 700. For example, the opening 701 may be provided in the upper wall 710. However, the disclosure is not limited thereto, and as such, according to another embodiment the opening may be provided at another location of the package housing 700. The cooling channel 200 and the condenser 800 (or radiator) may form a two-phase cooling system. According to an embodiment, the two-phase liquid cooling structure may include one cooling channel 200. However, the disclosure is not limited thereto, and as such, according to another embodiment, the two-phase liquid cooling structure may include a plurality of cooling channels 200. For example, a plurality of cooling channels 200 extending in a first direction (X) may be arranged in a third direction (Y). For example, a plurality of cooling channels 200 extending in the third direction (Y) may be arranged in the first direction (X). The plurality of cooling channels 200 may be individually connected to the condenser 800 (or radiator). However, the disclosure is not limited thereto, and as such, according to another embodiment, the plurality of cooling channels 200 may be collectively connected to the condenser 800 (or radiator). According to an embodiment, in which, a plurality of cooling channels 200 are formed in the semiconductor chip 100, the ultrasonic vibrator 300 described below may be arranged in each of the plurality of cooling channels 200. For example, a plurality of ultrasonic vibrators 300 may be provided, and each of the plurality of ultrasonic vibrators 300 may be arranged in one of the plurality of cooling channels 200. In addition, when the plurality of cooling channels 200 are joined together, the ultrasonic vibrator 300 may be arranged in each of the plurality of cooling channels 200, or may be arranged in at a junction of the plurality of cooling channels 200. According to an embodiment, a circulating pump circulating a coolant may be arranged between the condenser 800 (or radiator) and the cooling channel 200. According to an embodiment, a coolant storage may be arranged between the condenser 800 and the opening 701. A liquid coolant condensed and formed in the condenser 800 may be accommodated in the coolant storage, and then may be supplied to the cooling channel 200 through the opening 701 from the coolant storage. According to an embodiment, the package housing 700 may include a plurality of openings 701. For example, a liquid coolant may be supplied into the cooling channel 200 through a first opening 701 and exit the cooling channel 200 through a second opening 701A. According to an embodiment, the upper wall 710 of the package housing 700 forming the upper wall of the cooling channel 200 may be a cold plate having the heat radiation function, and a cold plate may be in contact with the upper wall 710 of the package housing 700.

According to an embodiment, a liquid coolant LC in the cooling channel 200 may absorb a heat from a heat source inside the semiconductor chip 100, for example, the semiconductor integrated circuit 120. The heated liquid coolant LC may be cooled by heat exchange with the outside at the condenser 800 (or radiator) and then supplied to the cooling channel 200. The liquid coolant LC in the cooling channel 200 may be vaporized and become a coolant vapor VC. The coolant vapor VC may be moved to the condenser 800 (or radiator) along the cooling channel 200. The coolant vapor VC may be phase-changed to the liquid coolant LC at the condenser 800 (or radiator), and then the liquid coolant LC may be moved to the inside of the semiconductor chip 100 along the cooling channel 200. According to such structure, the liquid coolant LC may be supplied to a location close to the heat source inside the semiconductor chip 100, which leads to effective cooling of the semiconductor chip 100. Moreover, the semiconductor chip 100 may be effectively cooled by using the evaporative latent heat in the phase change process of the coolant.

Figure 2:
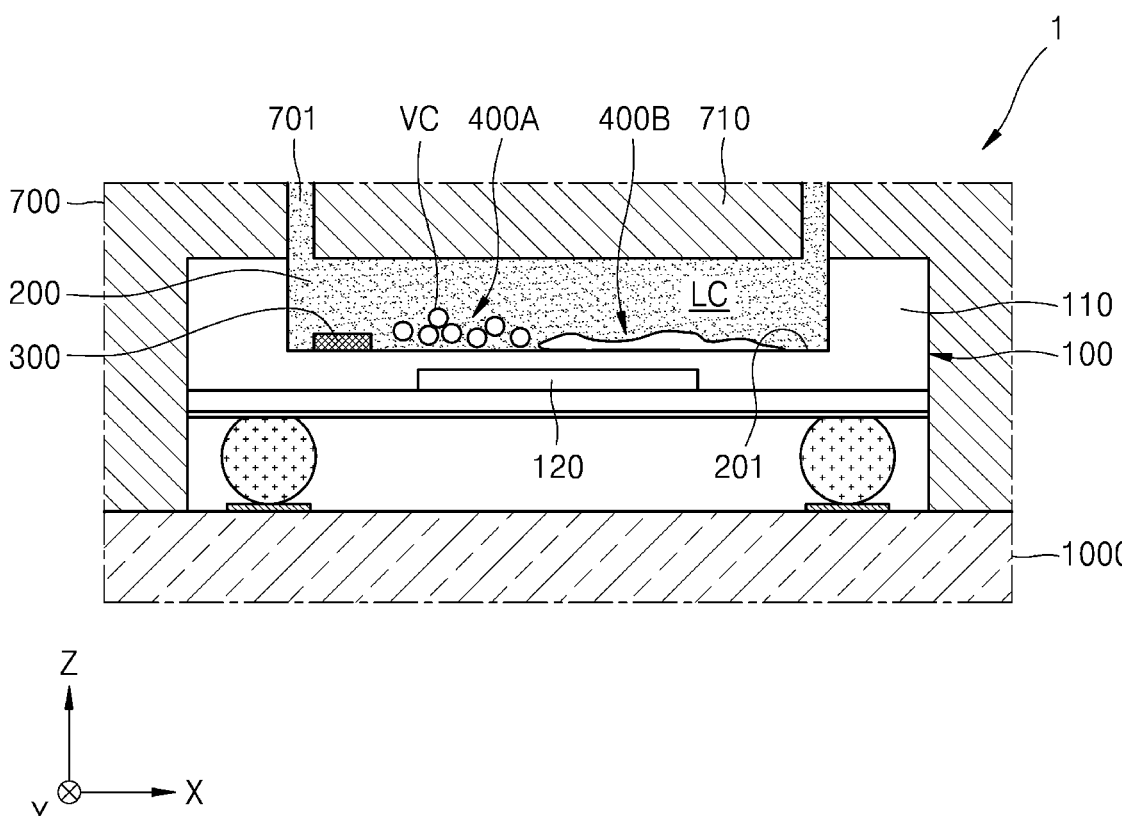
FIG. 2 is a diagram illustrating a state in which vapors are stagnant and a vapor film is formed in a cooling channel.

FIG. 2 is a diagram illustrating a state in which the coolant vapor VC is stagnant 400A and a vapor film 400B is formed in the cooling channel 200. The coolant vapors VC may be stagnant near a wall of the cooling channel 200, for example, a lower surface 201 adjacent to the semiconductor integrated circuit 120, which is the heat source, as denoted by the reference numeral 400A in FIG. 2. The coolant vapors VC attached to the wall of the cooling channel 200, for example, to the lower surface 201, may be combined with each other to form a vapor film on the lower surface 201 of the cooling channel 200 as denoted by the reference numeral 400B in FIG. 2. The stagnant coolant vapors 400A and the vapor film 400B may interfere with the contact between the liquid coolant LC and the lower surface 201 of the cooling channel 200 and cause an increase in thermal resistance. Due to this increase in the thermal resistance, a hot spot may be generated locally inside the semiconductor chip 100. For effective cooling, the coolant vapor VC generated inside the cooling channel 200 may need to be separated from the heat transfer surface, for example, from the lower surface 201 of the cooling channel 200.

According to an embodiment of the disclosure, the semiconductor device 1 may include the ultrasonic vibrator 300. The ultrasonic vibrator 300 may be arranged inside the cooling channel 200. The ultrasonic vibrator 300 may be at least partially immersed in the liquid coolant LC in the cooling channel 200. According to an embodiment, the ultrasonic vibrator 300 may be arranged on the lower surface 201 of the cooling channel 200 and entirely immersed in the liquid coolant LC. According to an embodiment, the ultrasonic vibrator 300 may be arranged closer to the opening 701. However, the disclosure is not limited thereto, and as such, the ultrasonic vibrator 300 may be arranged at any position in the cooling channel 200. The ultrasonic vibrator 300 may vibrate the liquid coolant LC. The vibration energy of the liquid coolant LC may be transmitted to the stagnant vapors 400A or the vapor film 400B in the cooling channel 200 and diminish the adhesion between the lower surface 201 of the cooling channel 200 and the stagnant vapors 400A or the vapor film 400B.

Figure 3:
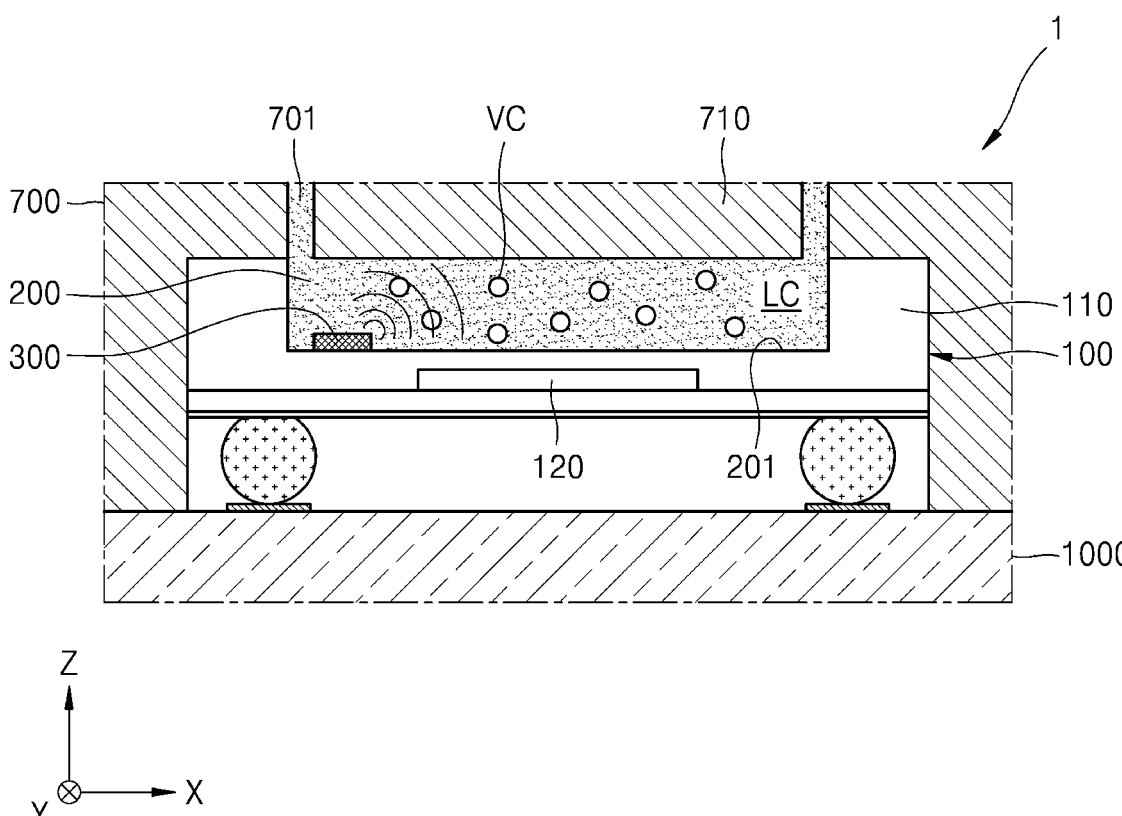
FIG. 3 is a diagram illustrating a state in which vapors are separated from a wall of a cooling channel.

FIG. 3 is a diagram illustrating a state in which vapors are separated from a wall of the cooling channel 200. As illustrated in FIG. 3, the stagnant vapors 400A near the lower surface 201 of the cooling channel 200 may move away from the lower surface 201 of the cooling channel 200 by the liquid coolant LC which has received vibration applied by the ultrasonic vibrator 300. In addition, the coolant vapors VC may be detached from the vapor film 400B formed on the lower surface 201 of the cooling channel 200, and the vapor film 400B may be reduced or removed.

In this manner, an increase in thermal resistance by the stagnant vapors 400A or the vapor film 400B may be reduced or prevented, and thus the cooling performance may remain constant. As the generation of hot spot is prevented or reduced, the heat may be effectively dissipated. As the ultrasonic vibrator 300 is arranged in the cooling channel 200 to vibrate the liquid coolant LC in the cooling channel 200, the stagnant vapors 400A and the vapor film 400B may be effectively removed to improve the cooling efficiency of the two-phase cooling system while not causing any damage to other components of the semiconductor device 1. Although FIG. 2 illustrates that the stagnant vapors 400A and the vapor film 400B are formed on the lower surface 201 of the cooling channel 200, the stagnant vapors 400A and the vapor film 400B may be formed on other surfaces of the cooling channel 200, for example, surfaces in the first direction (X) and the third direction (Y), and by employing the ultrasonic vibrator 300, the stagnant vapors 400A and the vapor film 400B formed on lateral surfaces may be removed.

Figure 4:
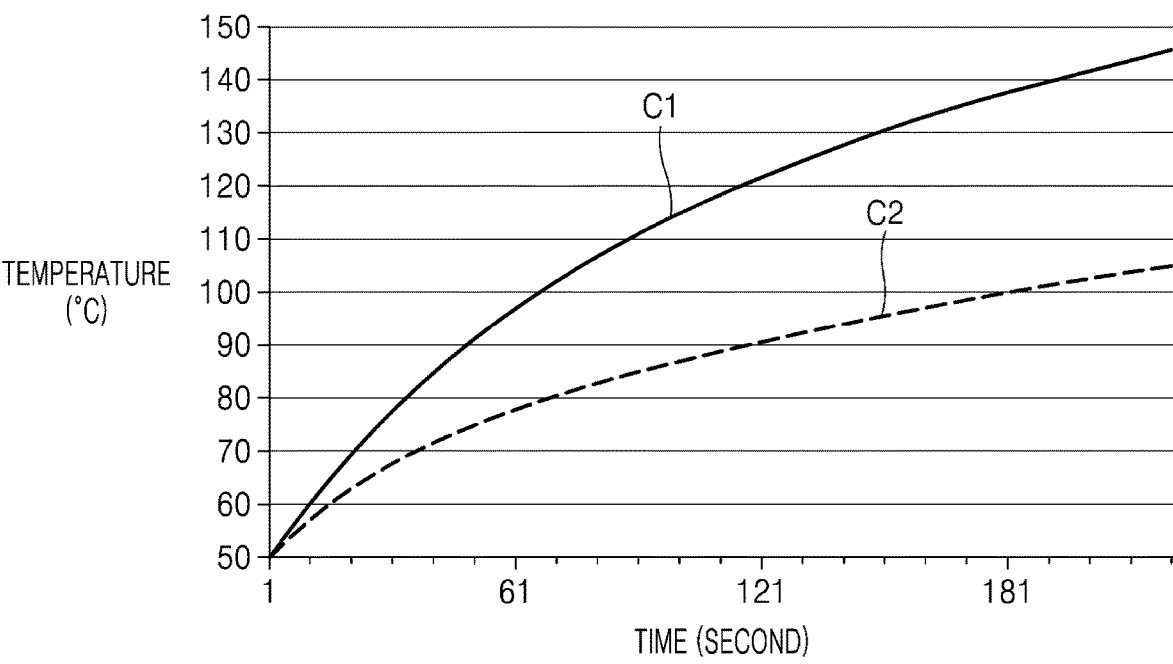
FIG. 4 is a graph illustrating results of a simulation experiment regarding cooling effects of a semiconductor device according to an embodiment.

FIG. 4 is a graph illustrating results of a simulation experiment regarding cooling effects of the semiconductor device 1 according to an embodiment. In FIG. 4, C1 represents the temperature change near the heat exchange surface over time when the stagnant vapors or the vapor film are formed on the heat exchange surface of the heating member. In FIG. 4, C2 represents the temperature change near the heat exchange surface over time when the stagnant vapors or the vapor film are not formed on the heat exchange surface of the heating member. As illustrated in FIG. 4, when the stagnant vapors and the vapor film are not formed, the temperature near the heat exchange surface is lower. Accordingly, by removing the vapors from the surface of the cooling channel 200 by using the ultrasonic vibrator 300 in the semiconductor device 1 according to an embodiment of the disclosure, the temperature of a cooling target, for example, the semiconductor chip 100 may be lowered.

Figure 5:
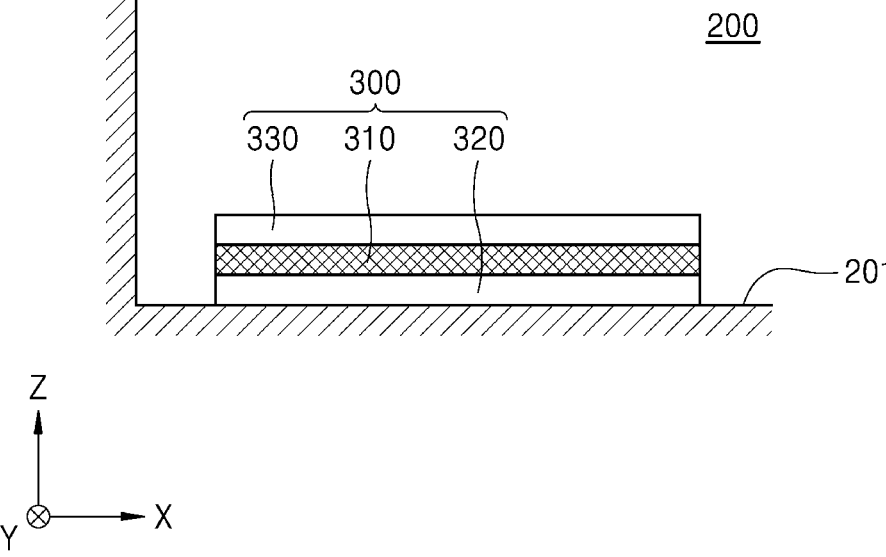
FIGS. 5 and 6 illustrate embodiments of an ultrasonic vibrator.
Figure 6:
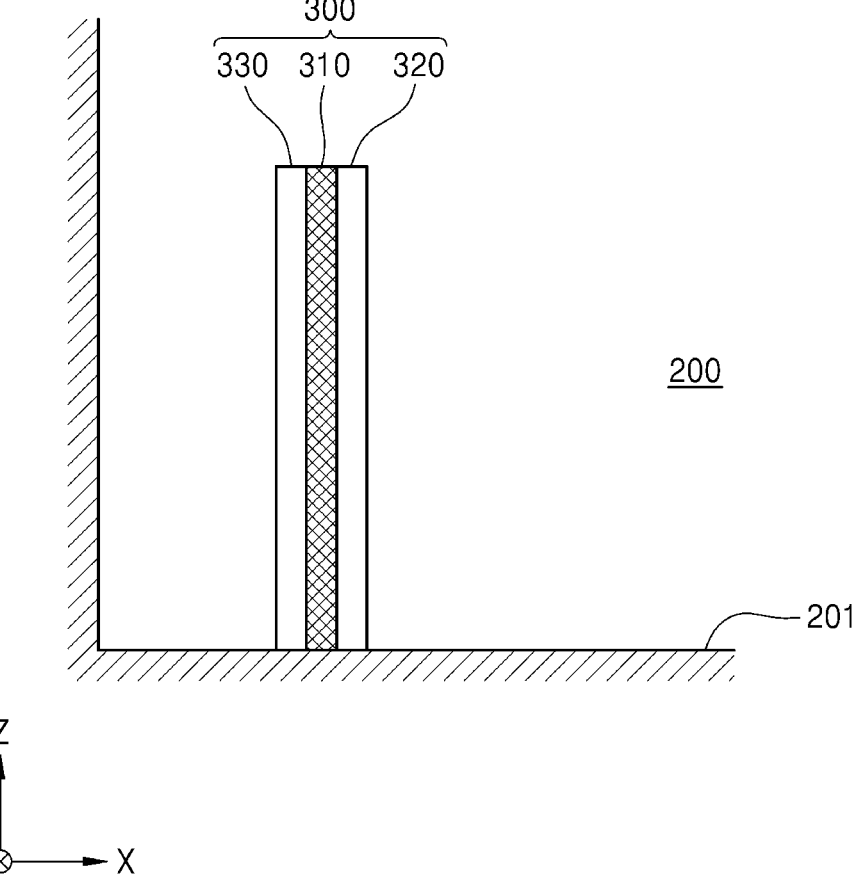

FIGS. 5 and 6 illustrate embodiments of the ultrasonic vibrator 300. A linear resonant actuator or a micro-machined ultrasonic transducer may be employed as the ultrasonic vibrator 300. The micro-machined ultrasonic transducer may be easily implemented in the semiconductor chip 100 by micro-electron mechanical systems (MEMS) technologies. The micro-machined ultrasonic transducer may be a piezoelectric micro-machined ultrasonic transducer (pMUT) or a capacitive micro-machined ultrasonic transducer (cMUT). FIGS. 5 and 6 illustrate an example of pMUT.

The ultrasonic vibrator 300 illustrated in FIG. 5 may have a length and a width or a width and a length in the transverse direction parallel with the heat transfer surface, for example, the lower surface 201 adjacent to the semiconductor integrated circuit 120, which is the heat source, among the walls of the cooling channel 200, that is, in the first direction (X) and the third direction (Y). For example, FIG. 5 illustrates the ultrasonic vibrator 300 having a length and a width in the first direction (X) and the third direction (Y). With reference to FIG. 5, the ultrasonic vibrator 300 may include a piezoelectric layer 310, a lower electrode layer 320, and an upper electrode layer 330. According to an embodiment, the piezoelectric layer 310 may be formed on the lower electrode layer 320, and the upper electrode layer 330 formed on the piezoelectric layer 310. The lower electrode layer 320, the piezoelectric layer 310, and the upper electrode layer 330 may be arranged in stacked manner, for example, in a second direction (Z). The lower electrode layer 320 may be formed on the lower surface 201 of the cooling channel 200. The piezoelectric layer 310 may be formed on the lower electrode layer 320, and the upper electrode layer 330 may be formed on the piezoelectric layer 310.

In another embodiment illustrated in FIG. 6, the ultrasonic vibrator 300 may extend in the thickness direction of the semiconductor chip 100 That is, the ultrasonic vibrator 300 may extend in the second direction (Z), from the heat transfer surface, for example, the lower surface 201 adjacent to the semiconductor integrated circuit 120, which is the heat source, among the walls of the cooling channel 200. The ultrasonic vibrator 300 may have a width in the first direction (X) or the third direction (Y). FIG. 6 illustrates the ultrasonic vibrator 300 having a width in the third direction (Y). With reference to FIG. 6, the ultrasonic vibrator 300 may include the piezoelectric layer 310 extending in the second direction (Z) from the lower surface 201 of the cooling channel 200, and the lower electrode layer 320 and the upper electrode layer 330, which are respectively arranged on either lateral surfaces of the piezoelectric layer 310 in the first direction (X). One end of the ultrasonic vibrator 300 in the first direction (Z) may be supported by the lower surface 201 of the cooling channel 200, and the other end portion may be a free end.

In FIGS. 5 and 6, the piezoelectric layer 310 may include a piezoelectric material. The piezoelectric layer 310 may include, for example, AlN, ZnO, SnO, PZT, ZnSnO₃, poly-vinylidene fluoride (PVDF), poly(vinylidene fluoride-trifluoroethylene) (P(VDF-TrFE)) or PMN-PT. The lower electrode layer 320 and the upper electrode layer 330 may include a conductive material such as aluminum, copper, titanium, molybdenum, etc. For example, the piezoelectric layer 310 may include an aluminum nitride. The piezoelectric layer 310 may be formed by depositing an aluminum nitride on the lower electrode layer 320. In this case, to improve the crystallinity of the aluminum nitride, the lower electrode layer 320 may include molybdenum. The upper electrode layer 330 may include aluminum.

The piezoelectric layer 310 may be deformed according to a driving voltage applied to lower electrode layer 320 and the upper electrode layer 330, and ultrasonic waves may be generated. The liquid coolant in the cooling channel 200 may be vibrated by the ultrasonic energy. By this vibration energy, the coolant vapor VC may be separated from the lower surface 201 of the cooling channel 200.

Figure 7:
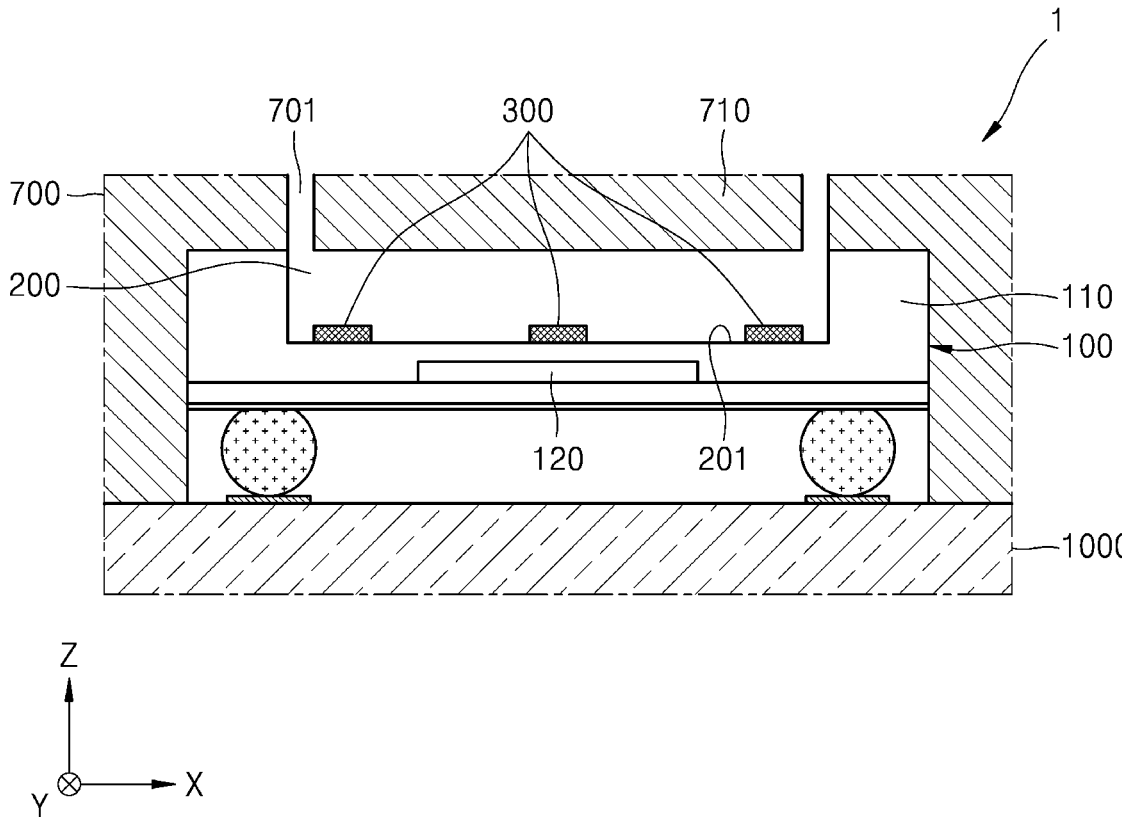
FIG. 7 is a schematic structural diagram of a semiconductor device according to an embodiment.

FIG. 7 is a schematic structural diagram of the semiconductor device 1 according to another embodiment. The embodiment of the semiconductor device 1 illustrated in FIG. 7 is different from the embodiment of the semiconductor device 1 illustrated in FIG. 1 in that semiconductor device 1 of FIG. 7 includes a plurality of ultrasonic vibrators 300. The descriptions of FIGS. 1 to 6 are applicable to FIG. 7 as well, and differences therebetween are further described below. With reference to FIG. 7, a plurality of ultrasonic vibrators 300 may be arranged in the cooling channel 200. That is, the plurality of ultrasonic vibrators 300 may be arranged in a same cooling channel 200. For example, the plurality of ultrasonic vibrators 300 may be arranged in the first direction (X) and/or the third direction (Y) on the lower surface 201 of the cooling channel 200. According to such arrangement, the vibration may be applied to the liquid coolant in multiple areas in the cooling channel 200, and thus, the stagnant vapors or the vapor film near the lower surface 201 of the cooling channel 200 may be more easily removed.

Figure 8:
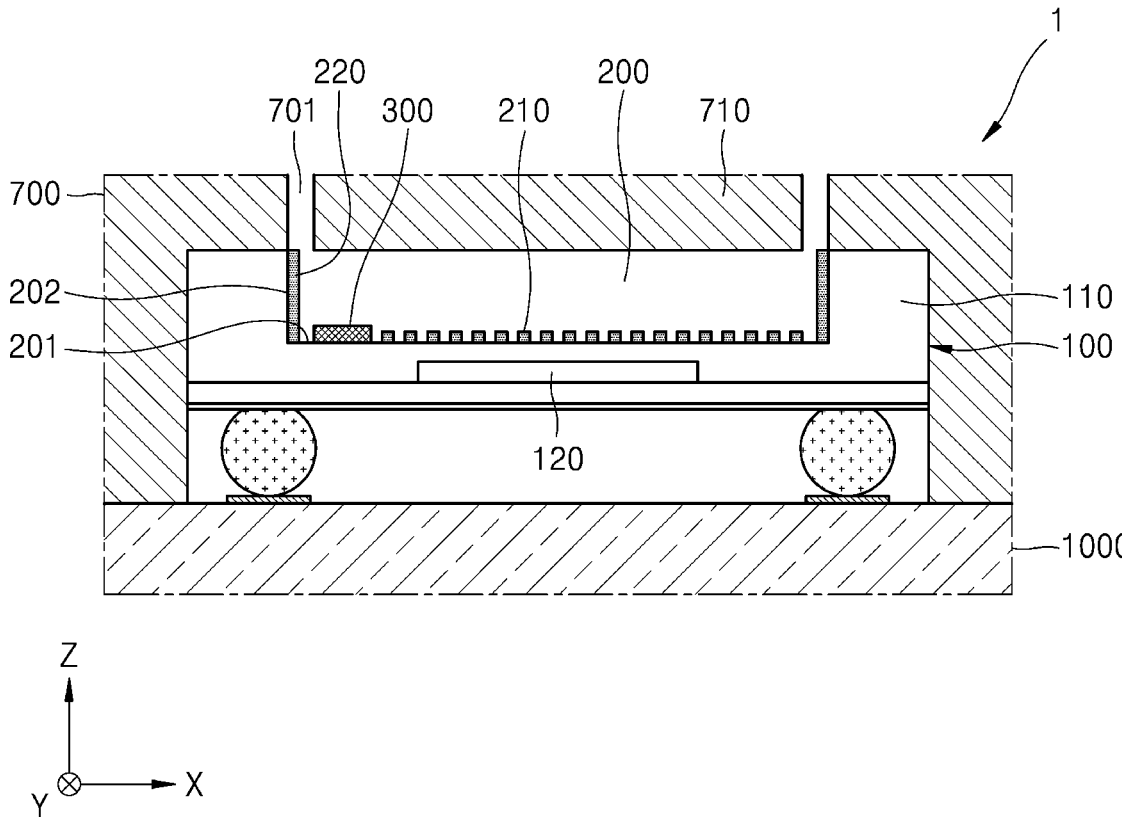
FIG. 8 is a schematic structural diagram of a semiconductor device according to an embodiment.

FIG. 8 is a schematic structural diagram of the semiconductor device 1 according to another embodiment. The embodiment of the semiconductor device 1 illustrated in FIG. 8 is different from the embodiment of the semiconductor device 1 illustrated in FIG. 7 in that a capillary pattern 210 is formed in the cooling channel 200. The descriptions of FIGS. 1 to 7 are applicable to FIG. 8 as well, and differences therebetween are further described below. With reference to FIG. 8, the semiconductor device 1 may include the capillary pattern 210. The capillary pattern 210 may be formed in the cooling channel 200 and move the coolant by the capillary force. The capillary pattern 210 may be formed on at least a part of the wall of the cooling channel 200. For example, the capillary pattern 210 may be formed on the wall adjacent to the semiconductor integrated circuit 120, which is the heat source, among the walls of the cooling channel 200, for example, the lower surface 201.

The heat generated at the heat source, i.e., the semiconductor integrated circuit 120 may be transferred to the liquid coolant in the cooling channel 200 through the lower surface 201 of the cooling channel 200, which is a heat transfer surface. Accordingly, the liquid coolant may need to be supplied quickly and sufficiently to the lower surface 201 of the cooling channel 200 without any left-out areas. The capillary pattern 210 may form the capillary force. The liquid coolant in the cooling channel 200 may be effectively moved by the capillary force to the lower surface 201 of the cooling channel 200 on which the capillary pattern 210 is formed and cover the lower surface 201 of the cooling channel 200. The liquid coolant may be phase-changed to vapors near the lower surface 201 of the cooling channel 200 by the heat exchange with the semiconductor integrated circuit 120. The vapors may be moved to other areas of the cooling channel 200 from near the lower surface 201 of the cooling channel 200 by the buoyancy or the vibration energy generated by the ultrasonic vibrator 300. The space the vapors near the lower surface 201 of the cooling channel 200 has left may be filled with the liquid coolant by the capillary force generated by the capillary pattern 210. Accordingly, the area near the lower surface 201 of the cooling channel 200 may be continuously filled with the liquid coolant. In this manner, the liquid coolant may be effectively supplied to the lower surface 201 of the cooling channel 200, which is a heat transfer surface where heat exchange between the semiconductor integrated circuit 120 and the coolant occurs.

Figure 9A:
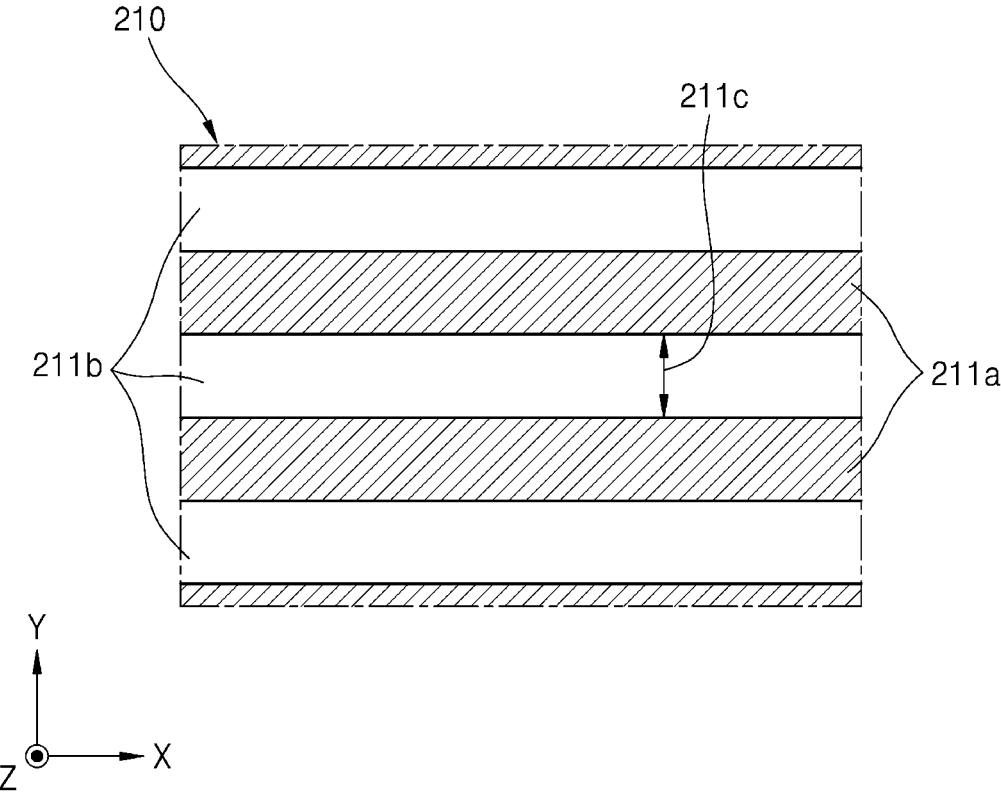
FIGS. 9A to 9C are schematic plan views illustrating various examples of a capillary pattern.
Figure 9B:
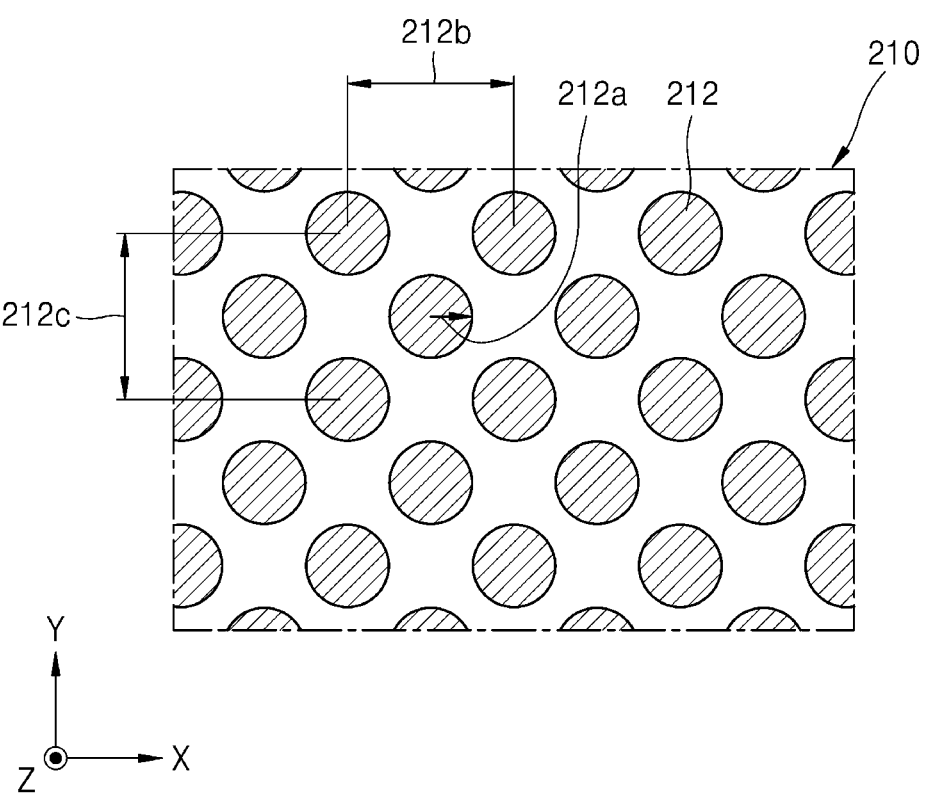
Figure 9C:
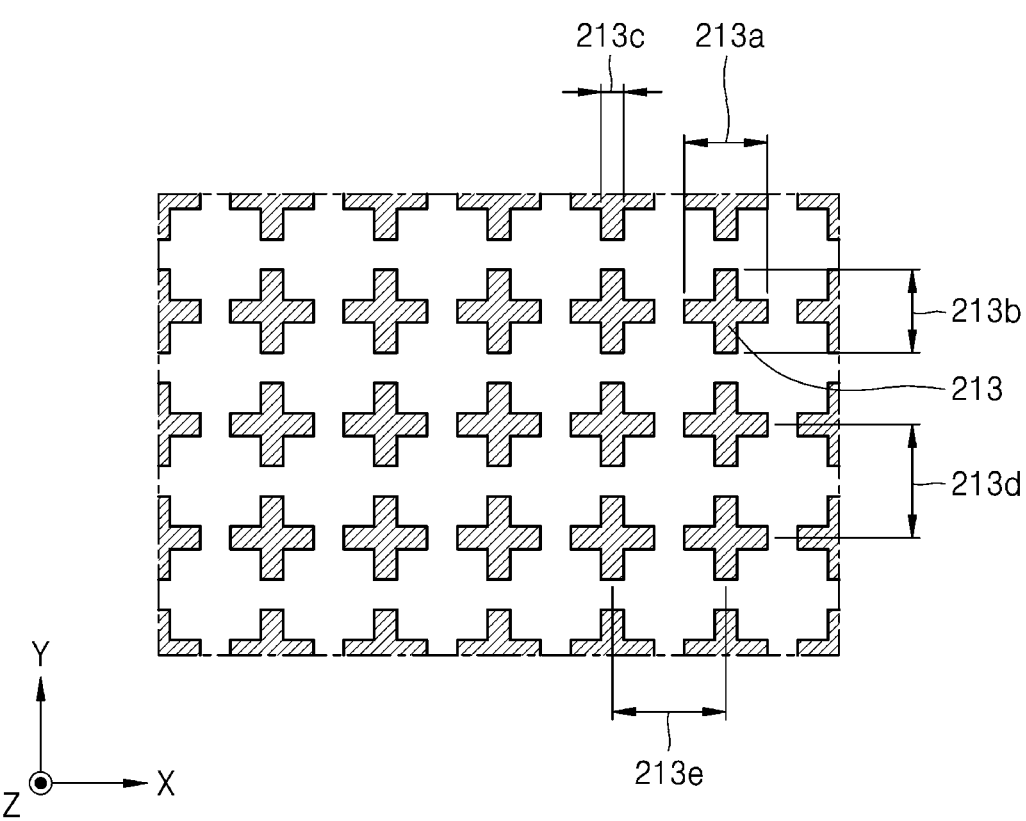

The capillary pattern 210 may have various structures capable of forming the capillary force. FIGS. 9A to 9C are schematic plan views illustrating various examples of the capillary pattern 210. With reference to FIG. 9A, the capillary pattern 210 may include a plurality of ridges 211*a* extending in the transverse direction, for example, in the first direction (X). The plurality of ridges 211*a* may protrude from the lower surface 201 of the cooling channel 200, for example, in the second direction (Z). The plurality of ridges 211*a* may be apart from each other with a gap 211*c* therebetween in the third direction (Y) to form a wick. A plurality of grooves 211*b* may be formed between the plurality of ridges 211*a*, and the liquid coolant may be moved along the plurality of grooves 211*b* by the capillary phenomenon. The gap 211*c*, i.e., the width of the groove 211*b* and the height of the groove 211*b* may be determined such that the capillary force capable of supplying a sufficient amount of liquid coolant near the lower surface 201 of the cooling channel 200 considering the heating value of the semiconductor integrated circuit 120 is generated.

With reference to FIGS. 9B and 9C, the capillary pattern 210 may include a plurality of fine protrusions (212 and 213) arranged two-dimensionally in the transverse direction, that is, the first direction (X) and the third direction (Y). The plurality of fine protrusions (212 and 213) may protrude from the lower surface 201 of the cooling channel 200 in the second direction (Z). The cross-section of the fine protrusion 212 illustrated in FIG. 9B may be circular. The liquid coolant may be moved to a space between two adjacent fine protrusions 212 by the capillary phenomenon. A height, a radius 212*a*, a gap 212*b* in the first direction (X), and a gap 212*c* in the third direction (Y) of the fine protrusion 212 may be determined such that the capillary force capable of supplying a sufficient amount of liquid coolant near the lower surface 201 of the cooling channel 200 considering the heating value of the semiconductor integrated circuit 120 is generated. The cross-section of the fine protrusion 213 illustrated in FIG. 9C may be a shape of cross. The liquid coolant may be moved to a space between two adjacent fine protrusions 213 by the capillary phenomenon. A height, a width 213*a* in the first direction (X), a length 213*b* in the third direction (Y), a line width 213*c*, a gap 213*e* in the first direction (X), and a gap 213*d* in the third direction (Y) of the fine protrusion 213 may be determined such that the capillary force capable of supplying a sufficient amount of liquid coolant near the lower surface 201 of the cooling channel 200 considering the heating value of the semiconductor integrated circuit 120 is generated.

Various embodiments of the capillary pattern 210 illustrated in FIGS. 9A to 9C are just examples, and the capillary pattern 210 may have various cross-sections and arrangements that are capable of forming the capillary force moving the liquid coolant. For example, in FIG. 9A, the cross-section of the ridges 211*a* in the longitudinal direction may have any shapes capable of generating the capillary force, including various polygonal shapes such as a triangular shape, a rectangular shape, etc., a partially circular shape, a partially elliptical shape, etc. Also, the ridges 211*a* may not need to have the same cross-section in the longitudinal direction, and the capillary pattern 210 may be implemented by ridges 211*a* having two or more different longitudinal cross-sections from each other. The shape of the fine protrusions (212 and 213) in FIGS. 9B and 9C may be polygonal or atypical. Also, the fine protrusions (212 and 213) may not need to have the same cross-section in the longitudinal direction, and the capillary pattern 210 may be implemented by fine protrusions (212 and 213) having two or more different longitudinal cross-sections from each other.

Referring back to FIG. 8, a capillary pattern 220 may be formed on a lateral surface 202 of the cooling channel 200. The capillary pattern 220 may include a plurality of ridges that protrude from the lateral surface 202, extend in the longitudinal direction along the lateral surface 202, and are arranged apart from each other in the transverse direction along the lateral surface 202. A plurality of grooved may be formed between the plurality of ridges. Such structure is the same as the embodiment of the capillary pattern 210 illustrated in FIG. 9A standing up in the longitudinal direction, i.e., the second direction (Z). In this case, the cross-section of the ridges in the transverse direction may have any shapes capable of generating the capillary force, including various polygonal shapes such as a triangular shape, a rectangular shape, etc., a partially circular shape, a partially elliptical shape, etc. Also, the ridges may not need to have the same cross-section in the transverse direction, and the capillary pattern 220 may be implemented by ridges having two or more different transverse cross-sections from each other.

Figure 10:
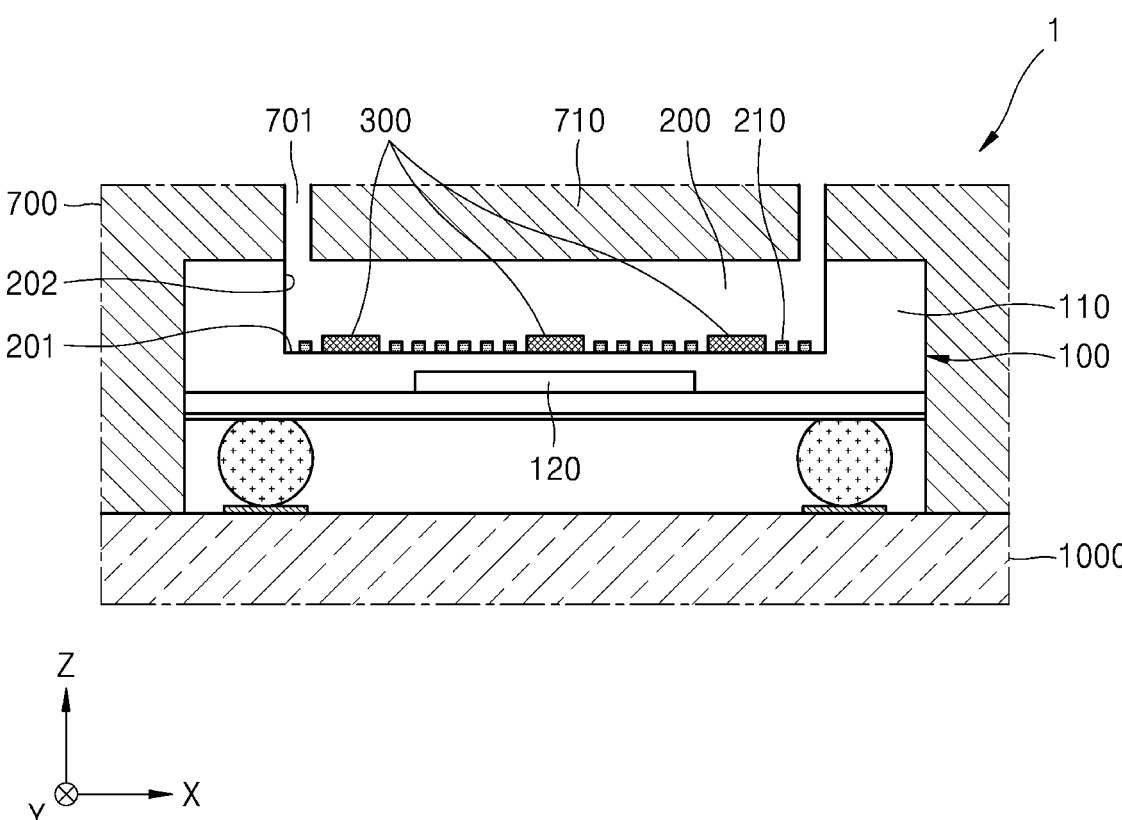
FIG. 10 is a schematic structural diagram of a semiconductor device according to an embodiment.

FIG. 10 is a schematic structural diagram of a semiconductor device 1 according to an embodiment. Although FIG. 8 illustrates one ultrasonic vibrator 300, a plurality of ultrasonic vibrators 300 may be arranged in the cooling channel 200 as illustrated in FIG. 10. With reference to FIG. 10, a plurality of ultrasonic vibrators 300 may be arranged in the cooling channel 200. For example, the plurality of ultrasonic vibrators 300 may be arranged in the first direction (X) and/or the third direction (Y) on the lower surface 201 of the cooling channel 200. According to such arrangement, the vibration may be applied to the liquid coolant in multiple areas in the cooling channel 200, and thus, the stagnant vapors or the vapor film near the lower surface 201 of the cooling channel 200 may be more easily removed.

Figure 11:
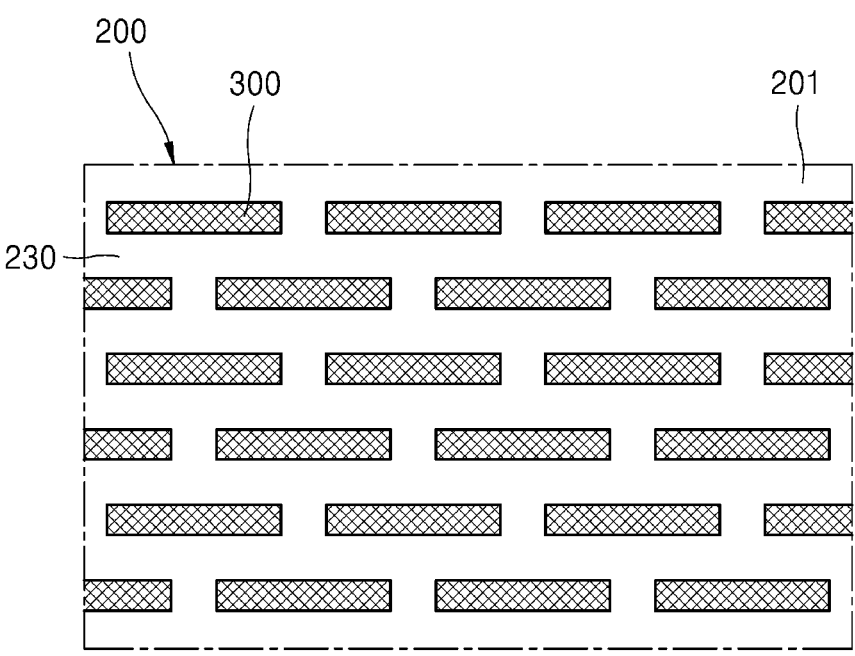
FIG. 11 is a plan view of an embodiment of a cooling channel.

The capillary pattern 210 may be implemented by a plurality of ultrasonic vibrators 300. That is, the plurality of ultrasonic vibrators 300 may form the capillary pattern 210 moving the coolant by the capillary force in the cooling channel 200. FIG. 11 is a plan view of an embodiment of the cooling channel 200. With reference to FIG. 11, the plurality of ultrasonic vibrators 300 may be arranged on the lower surface 201 of the cooling channel 200 in the transverse direction, i.e., the first direction (X) and the third direction (Y). Each of the plurality of ultrasonic vibrators 300 may be, for example, a micro-machined ultrasonic transducer. Each of the plurality of ultrasonic vibrators 300 may extend in the transverse direction, for example, the first direction (X) on the lower surface 201 of the cooling channel 200 as illustrated in FIG. 5. According to an embodiment, each of the plurality of ultrasonic vibrators 300 may extend in the third direction (Y) on the lower surface 201 of the cooling channel 200 or extend in any direction. Each of the plurality of ultrasonic vibrators 300 may extend in the thickness direction of the semiconductor chip 100, i.e., the second direction (Z) from the lower surface 201 of the cooling channel 200. Referring to FIG. 3, a capillary channel 230 may be formed between the plurality of ultrasonic vibrators 300, and the liquid coolant may be moved through the capillary channel 230 by the capillary force.

The plurality of ultrasonic vibrators 300 may form a part of the capillary pattern 210. For example, a part of the capillary pattern 210 may be formed by the plurality of ultrasonic vibrators 300 in the embodiments of the capillary pattern 210 illustrated in FIGS. 9A to 9C. The capillary pattern 210 may be formed entirely by the plurality of ultrasonic vibrators 300. The shape and arrangement of the plurality of ultrasonic vibrators 300 forming the capillary pattern 210 are not limited to the example illustrated in FIG.

11. The plurality of ultrasonic vibrators 300 may have various shapes and arrangements such that a gap between the plurality of ultrasonic vibrators 300 forms the capillary force.

Figure 12:
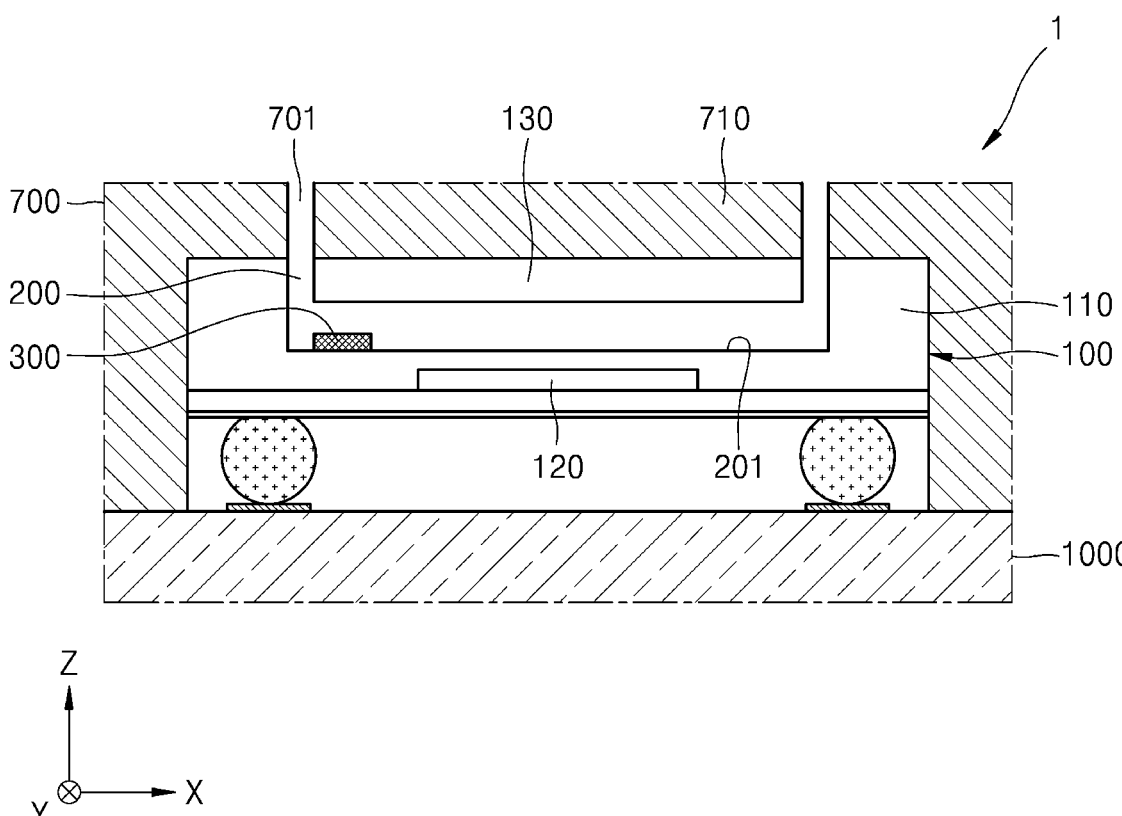
FIG. 12 is a schematic structural diagram of a semiconductor device according to an embodiment.

FIG. 12 is a schematic structural diagram of the semiconductor device 1 according to an embodiment. The embodiment of the semiconductor device 1 illustrated in FIG. 12 is different from the embodiment of the semiconductor device 1 illustrated in FIG. 1 in that the cooling channel 200 is formed entirely in the semiconductor chip 100, that is, in the substrate 110. With reference to FIG. 12, the cooling channel 200 may be formed in the semiconductor chip 100, that is, in the substrate 110. An upper portion 130 of the substrate 110 forms an upper wall of the cooling channel 200. The upper portion 130 may be a separate member from the substrate 110. The descriptions of embodiments of FIGS. 1 to 11 are applicable to the embodiment of the semiconductor device 1 illustrated in FIG. 12. That is, the semiconductor chip 100 of FIG. 12 may have a structure in which the ultrasonic vibrator 300 is arranged in the cooling channel 200 as illustrated in FIGS. 1 to 7, a structure in which the ultrasonic vibrator 300 and the capillary pattern 210 are formed in the cooling channel 200 as illustrated in FIGS. 8 to 10, or a structure in which the capillary pattern 210 implemented by the ultrasonic vibrator 300 is formed in the cooling channel 200 as illustrated in FIGS. 10 and 11.

According to the high integration and high performance of the semiconductor device 1, a plurality of semiconductor chips 100 may be stacked. The semiconductor device 1 having such stacked structure may be referred to as a 3D IC. In the semiconductor device 1 having a stacked structure, as a plurality of semiconductor chips 100 are stacked closely, an effective two-phase cooling structure may be required. The aforementioned two-phase cooling structure may be employed in the semiconductor device 1 having such structure.

Figure 13:
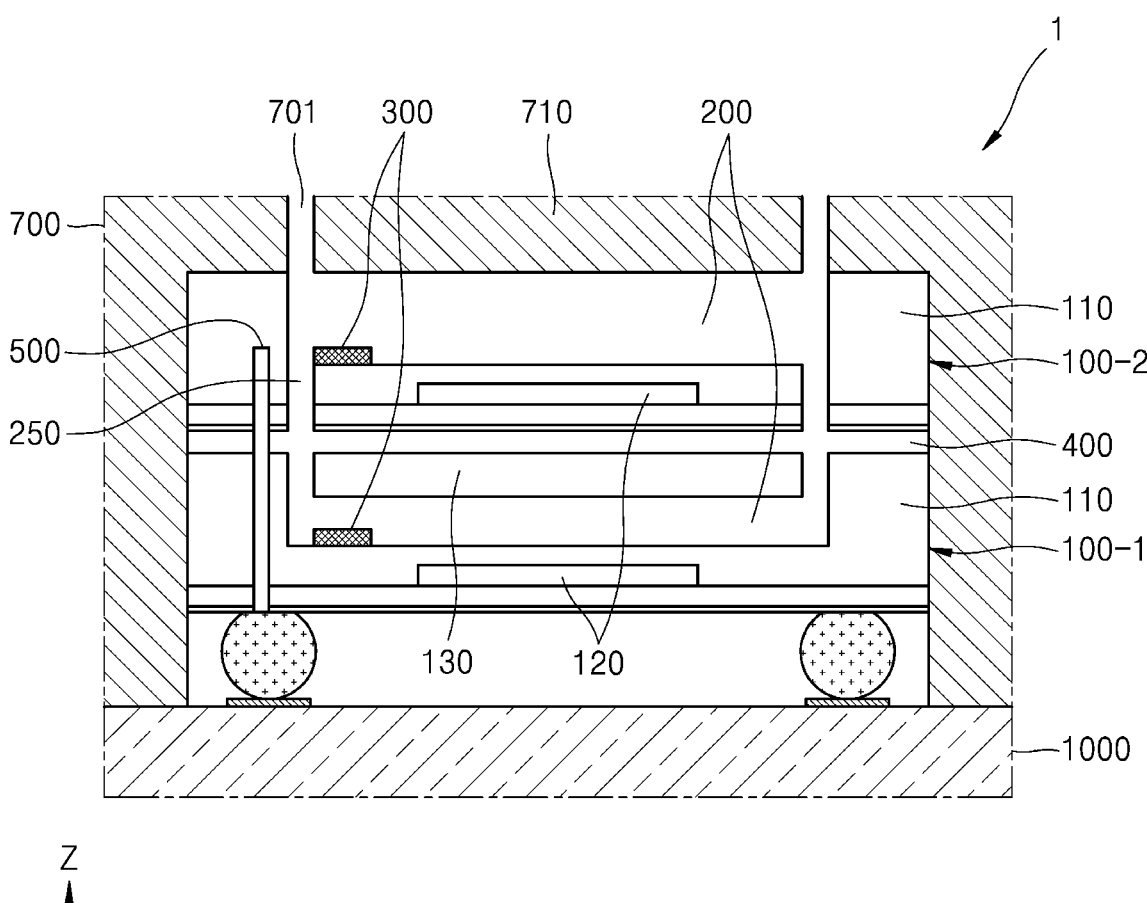
FIG. 13 is a schematic structural diagram of a semiconductor device according to an embodiment.
Figure 13:
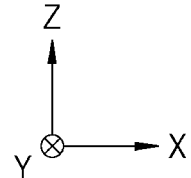

FIG. 13 is a schematic structural diagram of the semiconductor device 1 according to an embodiment. The semiconductor device 1 according to the embodiment is different from the embodiment of the semiconductor device 1 illustrated in FIG. 1 in that a plurality of semiconductor chips are included. Hereinafter, like reference numerals denote like members, and any redundant description will be omitted. With reference to FIG. 13, an embodiment of the semiconductor device 1 may include a plurality of semiconductor chips, for example, a first semiconductor chip 100-1 and a second semiconductor chip 100-2. The cooling channel 200 may be formed in each of the first semiconductor chip 100-1 and the second semiconductor chip 100-2. The first semiconductor chip 100-1 may have the same structure as the semiconductor chip 100 illustrated in FIG. 12. The second semiconductor chip 100-2 may be stacked on the first semiconductor chip 100-1. The second semiconductor chip 100-2 may be the same as the semiconductor chip 100 illustrated in FIG. 1, except that the second semiconductor chip 100-2 includes a connection channel 250 passing through the second semiconductor chip 100-2 in a thickness direction, i.e., the second direction (Z). The descriptions of FIGS. 1 to 11 are applicable to the first and second semiconductor chips 100-1 and 100-2. That is, the first and second semiconductor chips 100-1 and 100-2 of FIG. 13 may have a structure in which the ultrasonic vibrator 300 is arranged in the cooling channel 200 as illustrated in FIGS. 1 to 7, a structure in which the ultrasonic vibrator 300 and the capillary pattern 210 are formed in the cooling channel 200 as illustrated in FIGS. 8 to 10, or a structure in which the capillary pattern 210 implemented by the ultrasonic vibrator 300 is formed in the cooling channel 200 as illustrated in FIGS. 10 and 11.

The first semiconductor chip 100-1 may be, for example, mounted on the printed circuit board 1000 by a solder ball. The second semiconductor chip 100-2 may be electrically connected with the printed circuit board 1000 directly, and may be electrically connected with the printed circuit board 1000 via the first semiconductor chip 100-1. In the embodiment, the second semiconductor chip 100-2 may be electrically connected with the printed circuit board 1000 via the first semiconductor chip 100-1 by an electrical connection structure 500, for example, a through silicon via (TSV). A portion of the electrical connection structure 500 exposed to the outside of the first and second semiconductor chips 100-1 and 100-2 may be electrically passivated.

The first and second semiconductor chips 100-1 and 100-2 may be packaged by the package housing 700. The packaging housing 700 may surround the first and second semiconductor chips 100-1 and 100-2. The opening 701 connected with a second cooling channel 200 of the second semiconductor chip 100-2 may be provided in the package housing 700. The coolant may be moved to the cooling channel 200 and the connection channel 250 of the second semiconductor chip 100-2 through the opening 701. The coolant may be moved to the cooling channel 200 of the first semiconductor chip 100-1 through the connection channel 250. Although FIG. 13 illustrates that a gap 400 is formed between the first and second semiconductor chips 100-1 and 100-2, the first and second semiconductor chips 100-1 and 100-2 may be stacked without the gap 400. In this case, the connection channel 250 of the second semiconductor chip 100-2 and the cooling channel 200 of the first semiconductor chip 100-1 may be arranged in the longitudinal direction, i.e., the second direction (Z).

The liquid coolant may be supplied to the cooling channel 200 arranged in the first and second semiconductor chips 100-1 and 100-2. The liquid coolant may absorb heat from a heat source of the first and second semiconductor chips 100-1 and 100-2, for example, the semiconductor integrated circuit 120 and may be vaporized into vapors. The vapors stagnant or attached on a wall of a cooling channel 200 may be detached from the wall of the cooling channel 200 by the vibration energy of the ultrasonic vibrator 300 and may be moved to the outside of the cooling channel 200. The vapors may be phase-changed to a liquid coolant at the condenser 800 and then may be moved back to the cooling channel 200. According to such structure, the liquid coolant may be supplied close to the heat source in the stacked first and second semiconductor chips 100-1 and 100-2, which leads to effective cooling of the first and second semiconductor chips 100-1 and 100-2.

According to an embodiment, three or more semiconductor chips 100 may be stacked in the thickness direction, i.e., the second direction (Z). According to an embodiment, another semiconductor chip which does not employ a cooling structure may be arranged on the printed circuit board 1000. For example, the other semiconductor chip that does not employ a cooling structure may be packaged by a separate housing, or may be packaged along with the semiconductor chip 100 employing a cooling structure in one housing. The other semiconductor chip without a cooling structure may be sealed to avoid a contact with the coolant. According to an embodiment, a plurality of semiconductor chips may be arranged in the transverse direction. For example, in the embodiments of the semiconductor device 1 illustrated in FIGS. 1, 7, 8, 10, and 12, two or more semiconductor chips 100 may be arranged in the transverse direction.

According to the embodiments of a semiconductor device, by vibrating a coolant in a cooling channel by using an ultrasonic vibrator, stagnant vapors and/or vapor film may be reduced or removed. Accordingly, generation of hot spot may be reduced and prevented, and a semiconductor device having a two-phase cooling structure with improved cooling efficiency may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a semiconductor chip comprising a semiconductor integrated circuit;
a cooling channel formed in the semiconductor chip, the cooling channel configured to provide a path for moving a coolant; and
an ultrasonic vibrator arranged in the cooling channel and configured to vibrate the coolant,
wherein the ultrasonic vibrator is provided on a lower surface of the cooling channel, and
wherein the ultrasonic vibrator comprises a plurality of ultrasonic vibrators.

2. The semiconductor device of claim 1, wherein the ultrasonic vibrator is at least partially provided in the coolant in the cooling channel.

3. The semiconductor device of claim 1, wherein the ultrasonic vibrator is arranged on a heat transfer surface adjacent to the semiconductor integrated circuit of the cooling channel.

4. The semiconductor device of claim 3, wherein the ultrasonic vibrator extends in a transverse direction parallel with the heat transfer surface.

5. The semiconductor device of claim 3, wherein the ultrasonic vibrator extends from the heat transfer surface in a thickness direction of the semiconductor chip.

6. The semiconductor device of claim 1, further comprising:
a capillary pattern configured to move the coolant by a capillary force,
wherein the capillary pattern is formed on at least a part of a wall of the cooling channel.

7. The semiconductor device of claim 6, wherein the capillary pattern is formed on a heat transfer surface adjacent to the semiconductor integrated circuit of the cooling channel.

8. The semiconductor device of claim 1,
wherein the plurality of ultrasonic vibrators form a capillary pattern configured to the coolant by a capillary force in the cooling channel.

9. The semiconductor device of claim 8, wherein the ultrasonic vibrator extends in a thickness direction of the semiconductor chip from a heat transfer surface adjacent to the semiconductor integrated circuit of the cooling channel.

10. The semiconductor device of claim 1, wherein the ultrasonic vibrator comprises a micro-machined ultrasonic transducer.

11. The semiconductor device of claim 1, wherein the semiconductor chip comprises a first semiconductor chip and a second semiconductor chip stacked on the first semiconductor chip,
wherein the cooling channel comprises a first cooling channel provided in the first semiconductor chip and a second cooling channel provided in the second semiconductor chip,
wherein the ultrasonic vibrator comprises a first ultrasonic vibrator provided in the first semiconductor chip and a second ultrasonic vibrator provided in the second semiconductor chip.

12. The semiconductor device of claim 1, wherein at least a portion of the ultrasonic vibrator contacts a first surface of a substrate of the semiconductor chip, the first surface opposite to a second surface of the substrate on which the semiconductor integrated circuit formed.

13. A semiconductor device comprising:
a semiconductor chip comprising a substrate and a semiconductor integrated circuit formed on a first surface of the substrate;
a cooling channel formed on the substrate, the cooling channel configured to provide a path for moving a coolant;
a micro-machined ultrasonic transducer arranged at least partially provided in the coolant in the cooling channel and configured to vibrate the coolant; and
a capillary pattern configured to move the coolant by a capillary force in the cooling channel,
wherein the capillary pattern is formed on at least a part of a wall of the cooling channel.

14. The semiconductor device of claim 13, wherein the micro-machined ultrasonic transducer is arranged on a heat transfer surface adjacent to the semiconductor integrated circuit of the cooling channel.

15. The semiconductor device of claim 14, wherein the micro-machined ultrasonic transducer comprises a plurality of micro-machined ultrasonic transducers, and
wherein the plurality of micro-machined ultrasonic transducers form a capillary pattern configured to move the coolant.

16. The semiconductor device of claim 15, wherein the micro-machined ultrasonic transducer extends in a thickness direction of the semiconductor chip from a heat transfer surface adjacent to the semiconductor integrated circuit of the cooling channel.

17. The semiconductor device of claim 13, wherein the micro-machined ultrasonic transducer comprises a piezoelectric micro-machined transducer (pMUT).

18. The semiconductor device of claim 13, wherein the semiconductor chip comprises a first semiconductor chip and a second semiconductor chip stacked on the first semiconductor chip,
wherein the cooling channel comprises a first cooling channel provided in the first semiconductor chip and a second cooling channel provided in the second semiconductor chip,
wherein the micro-machined ultrasonic transducer comprises a first micro-machined ultrasonic transducer provided in the first semiconductor chip and a second micro-machined ultrasonic transducer provided in the second semiconductor chip.

19. An electronic device comprising:

a substrate comprising a plurality of electronic components;

a cooling channel, at least a portion of the cooling channel formed in the substrate, the cooling channel configured to provide a path for moving a coolant;

an ultrasonic vibrator arranged in the portion of the cooling channel formed in the substrate and configured to vibrate the coolant; and a capillary pattern configured to move the coolant by a capillary force, wherein the capillary pattern is formed on at least a part of a wall of the cooling channel.

\* \* \* \* \*